United States Patent [19]
Pellegrini

[11] Patent Number: 5,444,538
[45] Date of Patent: Aug. 22, 1995

[54] SYSTEM AND METHOD FOR OPTIMIZING THE GRID AND INTRAFIELD REGISTRATION OF WAFER PATTERNS

[75] Inventor: Joseph C. Pellegrini, Watertown, Mass.

[73] Assignee: New Vision Systems, Inc., Watertown, Mass.

[21] Appl. No.: 209,862

[22] Filed: Mar. 10, 1994

[51] Int. Cl.6 ............................................ G01B 11/00
[52] U.S. Cl. .................................... 356/401; 355/53
[58] Field of Search ............................. 356/399–401; 250/548; 355/43, 53

[56] References Cited

U.S. PATENT DOCUMENTS

| | | | |
|---|---|---|---|
| 4,054,386 | 10/1977 | Suzuki | 356/153 |
| 4,550,374 | 10/1985 | Meshman et al. | 356/401 |
| 4,659,227 | 4/1987 | Sato et al. | 356/401 |
| 4,703,434 | 10/1987 | Brunner | 356/356 X |
| 4,725,737 | 2/1988 | Nakata et al. | 250/548 |
| 4,768,883 | 9/1988 | Waldo et al. | 356/399 |
| 4,776,698 | 10/1988 | Crosdale | 356/345 |
| 4,780,617 | 10/1988 | Umatati et al. | 356/401 |
| 4,984,890 | 1/1991 | Tojo et al. | 356/401 X |
| 5,087,537 | 2/1992 | Conway et al. | |
| 5,120,134 | 6/1992 | Kosugi | 356/401 |
| 5,120,974 | 6/1992 | Muraki | 250/548 |
| 5,132,195 | 7/1992 | Pool | 356/401 X |
| 5,136,413 | 8/1992 | MacDonald et al. | |
| 5,142,156 | 8/1992 | Ozawa et al. | 356/401 X |
| 5,160,848 | 11/1992 | Saitoh et al. | 250/548 |
| 5,166,754 | 11/1992 | Suzuki et al. | 356/401 |
| 5,172,190 | 12/1992 | Kaiser | 356/401 |
| 5,214,493 | 5/1993 | Sugiyama et al. | 356/401 |

*Primary Examiner*—Richard A. Rosenberger
*Assistant Examiner*—K. P. Hantis
*Attorney, Agent, or Firm*—Dilworth & Barrese

[57] ABSTRACT

A system and method according to the invention identify assignable overlay error sources contributing to pattern misregistration on a wafer. Specifically, this system treats the case where a single overlay field from a given layer is sufficiently large to cover two or more fields patterned on any other layer. This system identifies values of correctable coefficients, such that when these values are applied to corrective adjustment to the vector field of measured overlay misregistration, the result tends to reduce the sums of the vector magnitudes to a minimum.

16 Claims, 8 Drawing Sheets o   Measurement Location o   Measurement Location

SYSTEM AND METHOD FOR OPTIMIZING THE GRID AND INTRAFIELD REGISTRATION OF WAFER PATTERNS

BACKGROUND OF THE INVENTION

1. Field of the Invention

This invention relates to the manufacture of integrated circuits and more particularly to the characterization and adjustment of steppers used for patterning integrated circuits on wafers.

2. Background of Related Art

The manufacture of integrated circuits involves multiple patterning steps that are principally carried out by devices known as steppers. These steppers typically employ step and repeat systems, whereby a mechanical stage is utilized to move a projection field relative to an exposure target. This motion is carried out in fixed increments across a two dimensional wafer surface with an exposure being made at each increment. Steppers using step and repeat systems are exemplified by products like the Nikon NSR-2005i9C, the Canon FPA20-00il, the ASM PAS 2500/40, and the Ultratech 2244i.

An alternative to steppers using step and repeat systems are steppers utilizing step and scan systems, exemplified by the SVGL Microscan II. The step and scan methodology specifies a stepper that moves the projection equipment in fixed increments, like a step and repeat system, but rather than exposing an entire field at once, a step and scan system scans across the exposure field with a narrow exposure window.

A stepper is composed of the following: 1) an illumination source of any type, including but not limited to ultraviolet light, x-rays, and electron beams; 2) a mask or reticle, upon which is a circuit pattern for the semiconductor device to be manufactured; 3) a lens assembly, composed of any number of elements, whose purpose is to project a real or latent image upon the wafer; 4) a stage, upon which is carried a target device plate or wafer; and 5) a controller for controlling the operation of the stepper.

In a typical integrated circuit (IC) fabrication process, different layers are patterned using multiple steppers—each stepper responsible for patterning a single layer on each product die. In a homogeneous manufacturing environment, all the steppers used to create a single product are of similar design. This generally results in each stepper producing a field image whose size is equal to or approximately equal to the field image size of the other steppers used in a process.

In a heterogeneous manufacturing environment (also known as mix and match), steppers of differing design are combined to create a single product. The field image sizes of these steppers might differ significantly. In some cases, a stepper design might be capable of imaging more than double the field area of another stepper design. This can lead to the possibility of using 2:1 field matching to increase product throughput. Referring to FIG. 1, in 2:1 field matching the wide field stepper will overlay a single wide field 10 such that it encompasses two narrow fields 12,14.

One task that is required to produce increased yields of working ICs is the calibration or matching of steppers in a production line. This matching typically involves a combination of hardware and software adjustments to the steppers. A representative list of possible adjustments include:

—Wafer rotation
—Stage motion scaling
—Stage motion orthogonality
—Mirror mapping
—Translation offset
—Magnification
—Reticle rotation (intrafield rotation)
—Field tilt.

The above adjustments are routinely carried out using embedded alignment and metrology systems which are part of the individual stepper systems. These embedded systems have limited ability to compensate for pattern misregistration due to the following reasons: 1) the number of intrafield and wafer sites observed by the alignment system is small such that there could exist significant difference between the observed or estimated misregistration and the true misregistration; and 2) each system is entirely embedded within a single stepper and is incapable of making or reporting adjustments to other steppers.

The above limitations are removed through the use of an independent overlay metrology system, such as the Prometrix EM-1, the IVS Accuvision, the KLA 5011, the OSI Metra, and the BioRad Quaestor.

An overlay metrology tool is composed of the following: 1) a system for loading one or more previously patterned wafers into a handling system; 2) a handling system that positions individual wafers relative to a measurement system; 3) a measurement system that measures the overlay misregistration at a number of locations on the wafer; and 4) a system for recording, storing, and/or transmitting the measurement information. Mechanisms for performing the overlay measurements include, but are not limited to, 1) analysis of optical images of the patterned wafer surface observed through a microscope and recorded using a digital imaging system; and 2) differential electrical resistance measurements obtained via physical probing of structures on the wafer surface.

Patterning can be accomplished using a blind-step technique, whereby the stepper places a pattern on a blank wafer absent of alignment marks. Alternatively, if alignment marks are present on a previously patterned layer, a stepper can utilize an alignment system to pattern a new layer which is aligned to the layer upon which the marks reside.

In step and repeat systems and in step and scan systems the stage is responsible for moving the wafer in a precisely stepped pattern such that individual dies can be illuminated by the patterning field. The number of dies on a wafer is a function of the die size, the size of the wafer, and the organization of dies. The size of the patterning field on a stepper is typically equal to or greater than the size of the dies upon which the image is being patterned.

In a homogeneous fabrication environment (same steppers design), the field sizes of the steppers are all approximately the same. The result is that each stepper is only able to pattern a single die at each step position.

2:1 field matching is possible when the pattern field areas on one or more steppers in a production line are at least twice as large as the dies that are being imaged. Typically, this requires moving to a heterogeneous stepper line by mixing different design steppers that have different maximum field sizes. An example of such mixing is an Ultratech 2244i 1X stepper mixed with current reduction steppers from Nikon, Canon, and ASM. The Ultratech 2244i has a maximum field size of 22 mm×44 mm on the wafer. Current reduction steppers have maximum field sizes on the order of 22 mm×22 mm. This leads to the possibility of using the Ultratech 2244i to simultaneously pattern two reduction fields.

The characterization of assignable overlay sources for homogeneous 1:1 stepper matching has been analyzed and applied in a number of forums. Utilization of these 1:1 models in a 2:1 scenario has yielded sub-optimal results that are extremely difficult to relate to the true assignable error sources. The system according to the present invention characterizes 2:1 stepper matching such that the end result of an analysis can be directly related to actual assignable sources.

SUMMARY OF THE INVENTION

The overlay optimization system according to the present invention is for manufacturing a wafer using heterogenous field imaging of patterns. The system comprises a first field stepper having a first field size; a second field stepper having a second field size, the second field size being greater than the first field size; a metrology tool for measuring a plurality of coordinates of a plurality of patterns laid down by the first field stepper and the second field stepper; a processor for processing the plurality of coordinates to generate an overlay coefficient associated with an assignable source, the processor for calculating an overlay error associated with the assignable source using the overlay coefficient; and a mechanism for adjusting a respective stepper controller of the first stepper and the second stepper to reduce the overlay error.

In an embodiment according to the present invention, the overlay optimization system uses least squares estimation to generate said overlay coefficient from said plurality of coordinates.

The present invention also includes a method for optimizing wafer stepper overlaying using a first field stepper, a second field stepper and a processor, comprising the steps of patterning a first field layer on a wafer using the first field stepper; patterning a second field layer overlaying said first field layer using the second field stepper; measuring overlay misregistration between the first field layer and the second field layer as misregistration data; processing the misregistration data to generate an overlay coefficient associated with an assignable source; calculating an overlay error associated with said assignable source using said overlay coefficient; and adjusting the patterning of the first field stepper and the second field stepper to reduce said overlay error.

BRIEF DESCRIPTION OF THE DRAWINGS

An embodiment of the invention will now be described, by way of example, with reference being made to accompanying drawings in which.

DETAILED DESCRIPTION OF THE PREFERRED EMBODIMENTS

One primary function of the system and method according to the present invention is to optimize the grid (interfield) and intrafield registration of patterns between layers in a 2:1 field matching setup. This is accomplished by collecting and analyzing misregistration data and correlating the data with assignable sources of overlay error. The correlated information is used to optimally correct the sources of error and thus result in minimized overlay error on future product wafers passed through the same manufacturing process.

Figure 1:
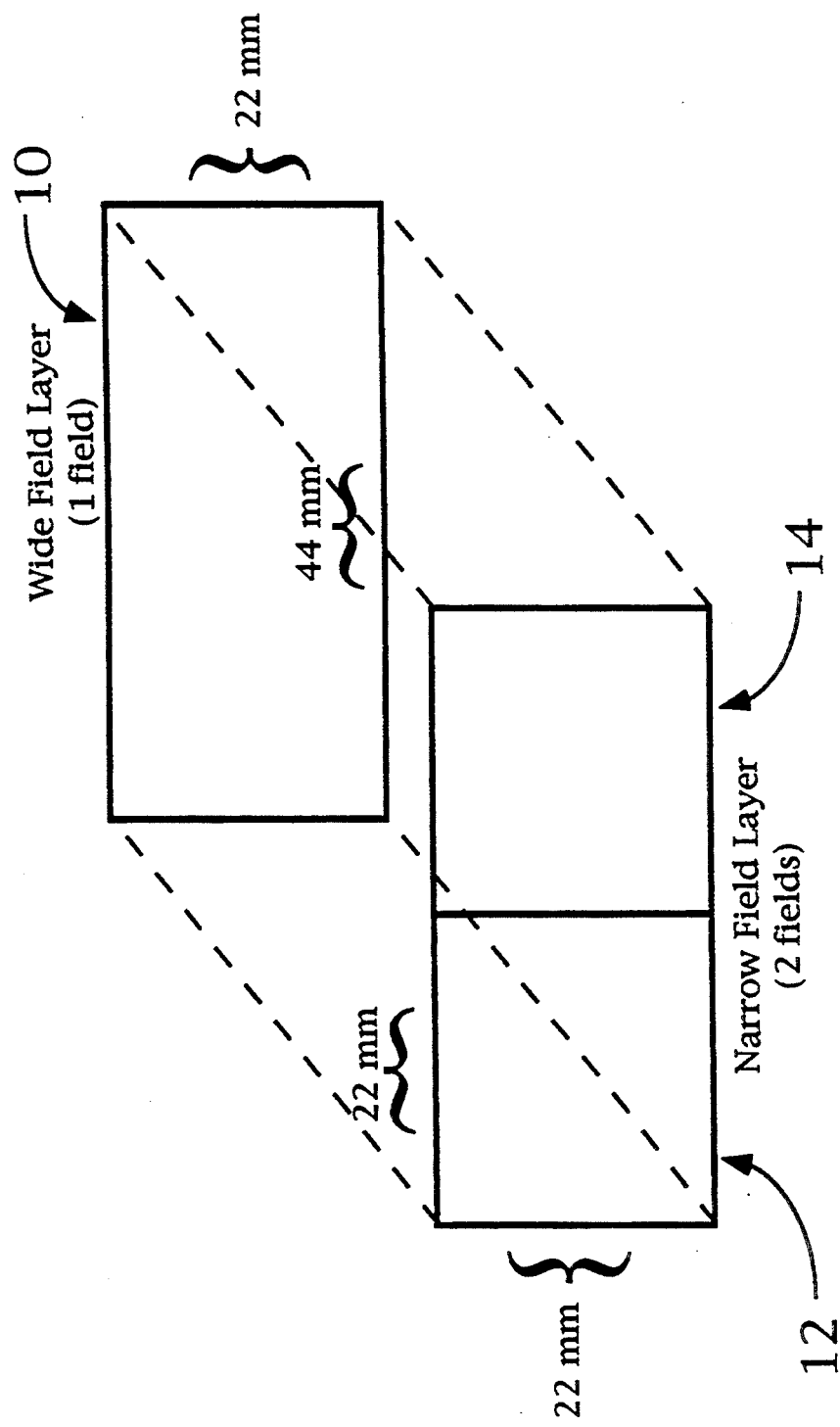
FIG. 1 represents an exploded view of the relative geometries of three exposure fields. Two of these fields are represented as being exposed by the narrow field stepper on one layer, the third field is represented as being exposed by the wide field stepper on another layer.
Figure 1A:
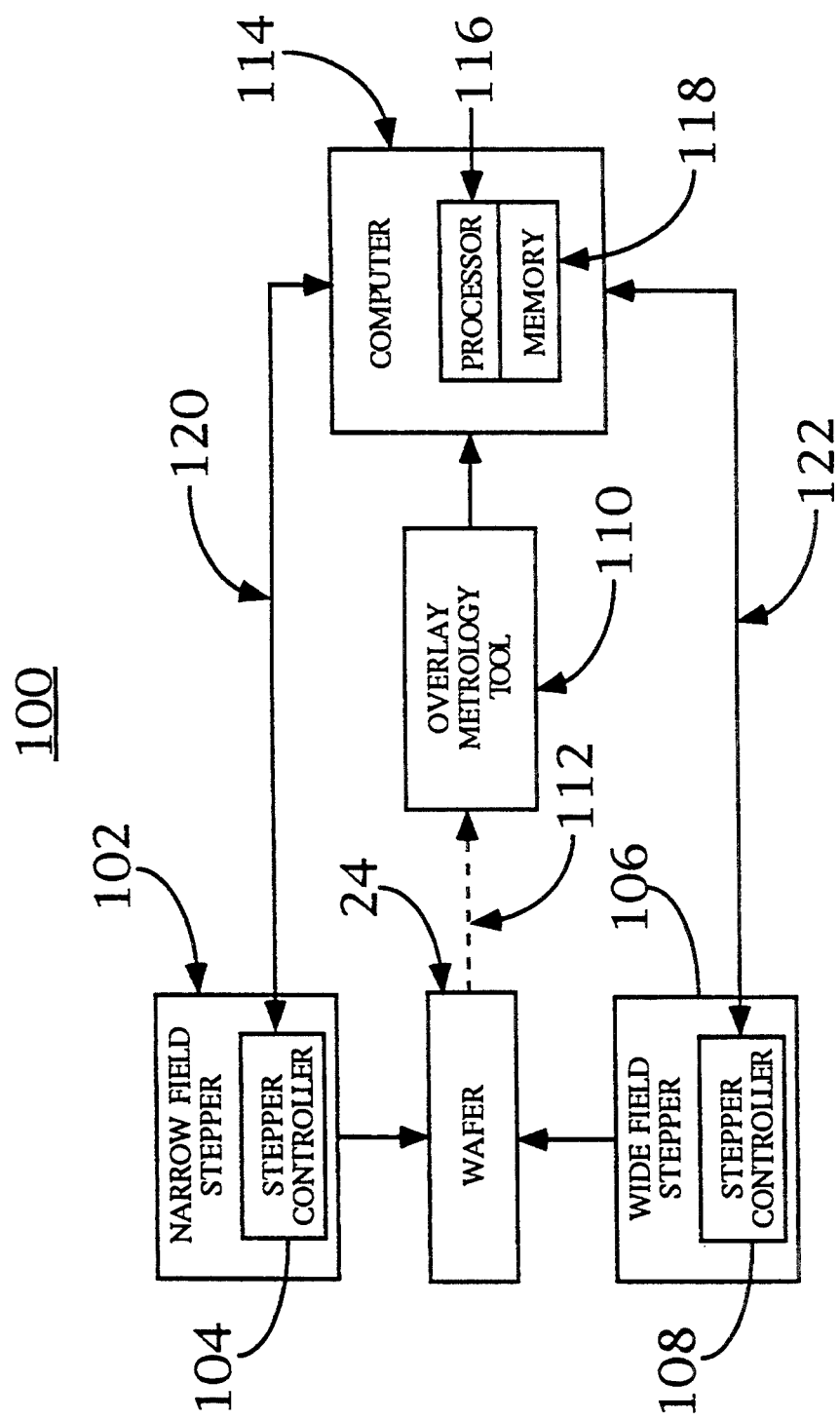
FIG. 1A illustrates a block diagram of the system of the present invention.

Referring to FIG. 1A, the overlay optimization system 100 comprises a narrow field stepper 102 operated by stepper controller 104, a wide field stepper 106 operated by stepper controller 108, an overlay metrology instrument 110, and a digital computer 114 having a processor 116, associated memory 118 and stored software.

Figure 2:
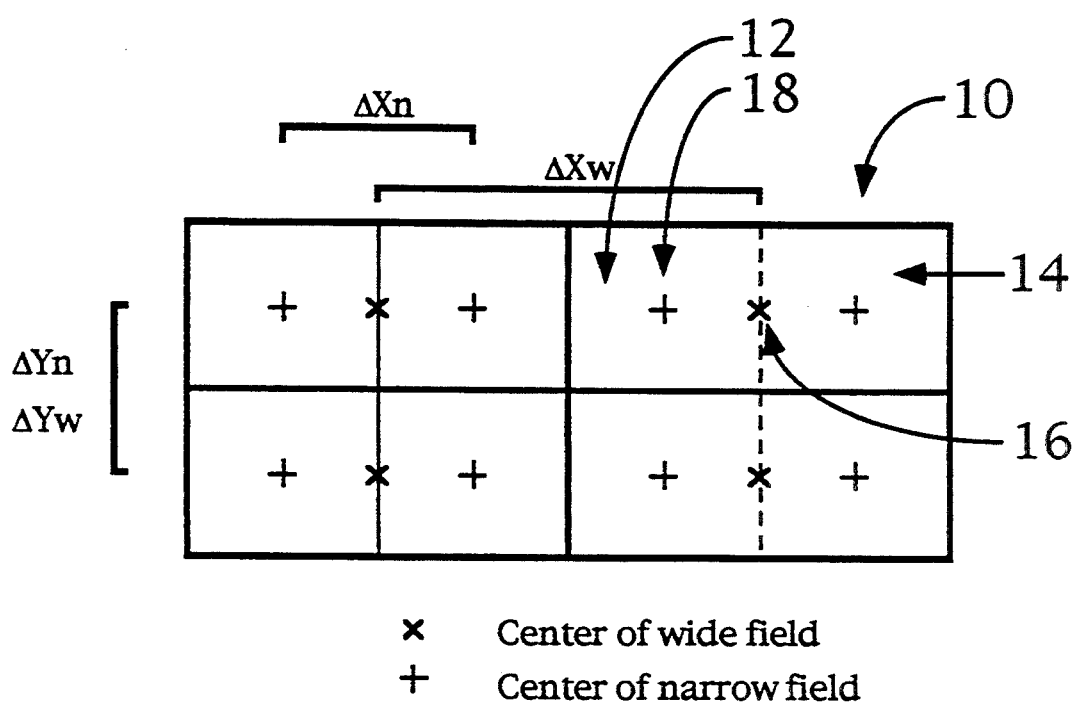
FIG. 2 represents the top-down view of four wide exposure fields overlayed upon eight narrow exposure fields for the horizontal matching case. The geometric centers of the narrow and wide fields are indicated for each of the twelve fields. The stepper stage increments $\Delta X_n$, $\Delta Y_n$, $\Delta X_w$, and $\Delta Y_w$, are defined relative to the field geometries.
Figure 3:
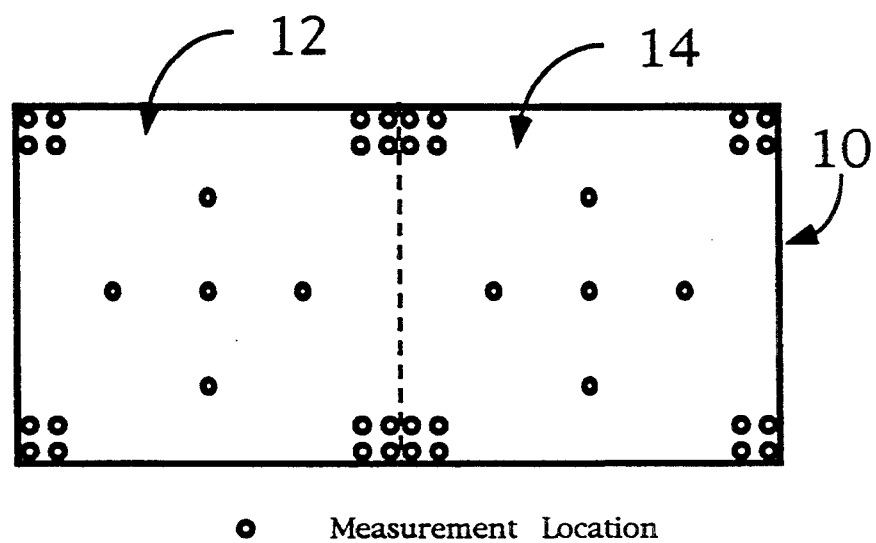
FIG. 3 represents a pattern for the location of measurement sites within a 2:1 matching field.
Figure 4:
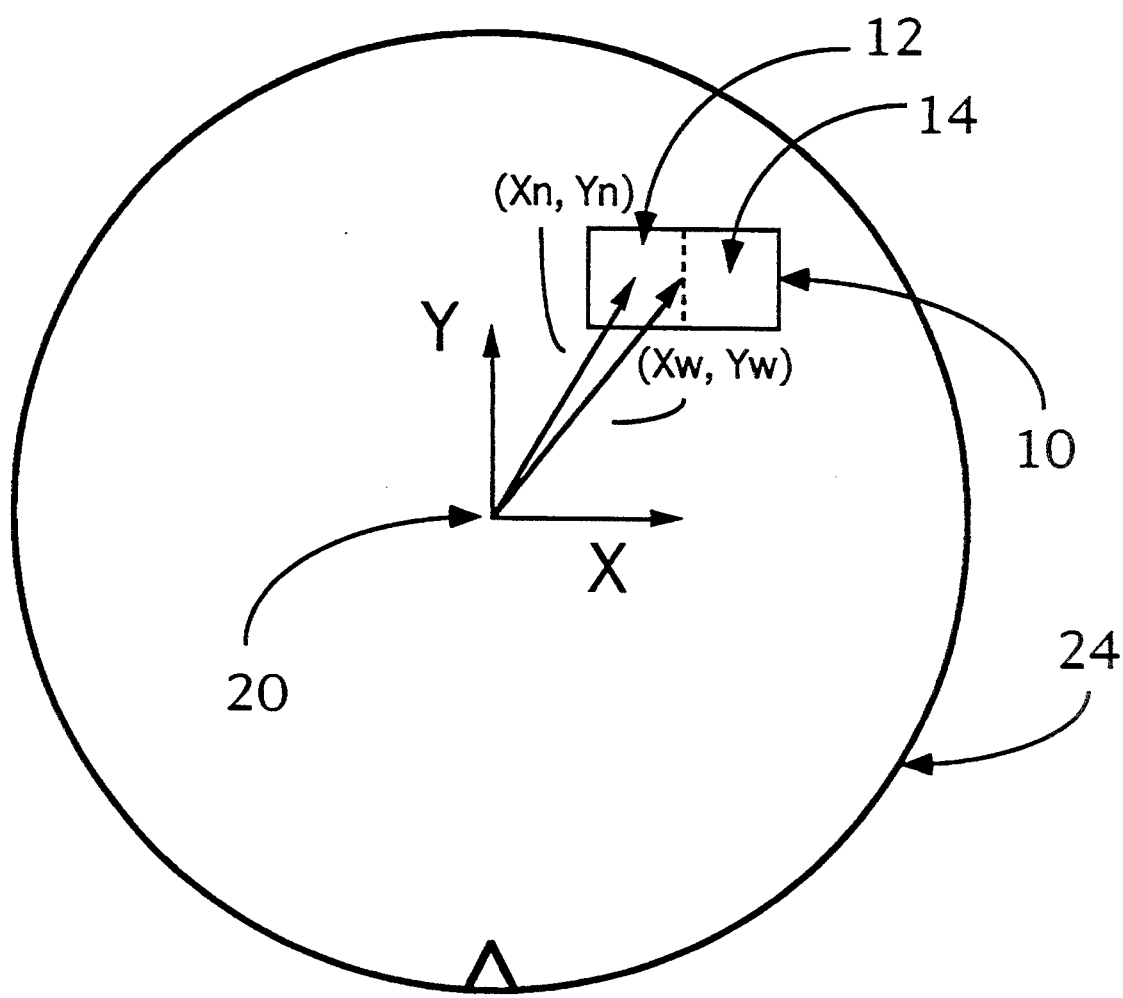
FIG. 4 represents the definition of the grid coordinates $X_n$, $Y_n$, $X_w$, and $Y_w$ relative to a wafer center for a specific 2:1 matching field.

The 2:1 field matching system according to a preferred embodiment of the present invention operates as follows:

Referring to FIGS. 2 to 4 in conjunction with FIG. 1A, the first layer (Layer 1) of a semiconductor product is patterned using the narrow field stepper 102 performing a blind step. The second and/or subsequent layers are patterned by the wide field stepper 106 using an alignment system guided by marks patterned within Layer 1. For each stepped position, the wide field stepper 106 will simultaneously pattern two (2) narrow stepper fields.

Grid errors induced by assignable sources on the narrow field stepper 102 can be described as:

$$V_{nx} = T_{xn} + S_{xn}X_n + \theta_{gn}Y_n - \Phi_n Y_n$$

$$V_{ny} = T_{yn} + S_{yn}Y_n - \theta_{gn}X_n$$

Grid errors induced by assignable sources on the wide field stepper 106 can be described as:

$$V_{wx} = T_{xw} + S_{xw}X_w + \theta_{gw}Y_w - \Phi_w Y_w$$

$V_{wy} = T_{yw} + S_{yw}Y_w - \theta_{gw}X_w$

The variables and coefficients used in the above equation are defined as follows.

| | |
|---|---|
| $(X_w, Y_w)$ | X-Y coordinates of the center 16 of the wide field 10 in which the point of interest resides relative to the center 20 of the wafer 24, shown in FIG. 4. All points residing in the same wide field 10 will have the same wide field grid coordinates regardless of their position within the field. |
| $(X_n, Y_n)$ | X-Y coordinates of the center 18 of the narrow field 12 in which the point of interest resides relative to the center 20 of the wafer 24. All points residing in the same narrow field 12 will have the same narrow field grid coordinates regardless of their position within the field. |
| $(X_w, Y_w)$ | X-Y coordinates of the site relative to the center 16 of the wide field 10 in which it resides. |
| $(X_n, Y_n)$ | X-Y coordinates of the site relative to the center 18 of the narrow field 12 in which it resides. |
| $V_{nx}$ | The total X error vector contribution of the narrow field stepper 102. |
| $V_{ny}$ | The total Y error vector contribution of the narrow field stepper 102. |
| $V_{wx}$ | The total X error vector contribution of the wide field stepper 106. |
| $V_{wy}$ | The total Y error vector contribution of the wide field stepper 106. |
| $T_{xn}$ | The X offset (translation) error induced by the narrow field stepper 102. ($\mu$m) |
| $T_{yn}$ | The Y offset (translation) error induced by the narrow field stepper 102. ($\mu$m) |
| $T_{xw}$ | The X offset (translation) error induced by the wide field stepper 106. ($\mu$m) |
| $T_{yw}$ | The Y offset (translation) error induced by the wide field stepper 106. ($\mu$m) |
| $S_{xn}$ | The X scale error induced by the narrow field stepper 102. (ppm) |
| $S_{yn}$ | The Y scale error induced by the narrow field stepper 102. (ppm) |
| $S_{xw}$ | The X scale error induced by the wide field stepper 106. (ppm) |
| $S_{yw}$ | The Y scale error induced by the wide field stepper 106. (ppm) |
| $\Theta_{gn}$ | The wafer rotation error of the narrow field stepper 102. ($\mu$ radians) |
| $\Theta_{gw}$ | The wafer rotation error of the wide field stepper 106. ($\mu$ radians) |
| $\Phi_n$ | The wafer orthogonality error of the narrow field stepper 102. (ppm) |
| $\Phi_w$ | The wafer orthogonality error of the wide field stepper 106. (ppm) |

Intrafield errors induced by assignable sources on the narrow field stepper 102 can be described as:

$v_{nx} = R_n x_n + \theta_{in} y_n + \Psi_1 x_n^2 + \Psi_2 x_n y_n$ $v_{ny} = R_n y_n - ''_{in} x_n + \Psi_1 x_n y_n + \Psi_2 y_n^2$ Intrafield errors induced by assignable sources on the wide field stepper 106 can be described as:

$v_{wx} = R_w x_w + \theta_{iw} y_w + \Psi_1 x_w^2 + \Psi_2 x_w y_w$ $v_{wy} = R_w y_w - \theta_{iw} x_w + \Psi_1 x_w y_w + \Psi_2 y_w^2$ The variables and coefficients used in the above equation are defined as follows.

| | |
|---|---|
| $(X_w, Y_w)$ | X-Y coordinates of the site relative to the center of the wide field in which it resides. |
| $(X_n, Y_n)$ | X-Y coordinates of the site relative to the center of the narrow field in which it resides. |
| $V_{nx}$ | The intrafield X error vector contribution of the narrow field stepper 102. |
| $V_{ny}$ | The intrafield Y error vector contribution of the narrow field stepper 102. |
| $V_{wx}$ | The intrafield X error vector contribution of the wide field stepper 106 (grid errors removed). |
| $V_{wy}$ | The intrafield Y error vector contribution of the wide field stepper 106 (grid errors removed). |
| $R_n$ | The reduction (magnification) error induced by the narrow field stepper 102. (ppm) |
| $R_w$ | The reduction (magnification) error induced by the wide field stepper 106. (ppm) |
| $\Theta_{in}$ | The reticle rotation error of the narrow field stepper 102. ($\mu$ radians) |
| $\Theta_{iw}$ | The reticle rotation error of the wide field stepper 106. ($\mu$ radians) |
| $\Psi_{1n}, \Psi_{2n}$ | The field tilt error of the narrow field stepper 102. (nm/mm$^2$) |
| $\Psi_{1w}, \Psi_{2w}$ | The field tilt error of the wide field stepper 106. (nm/mm$^2$) |

Referring again to FIG. 1A, after patterning and development steps have been completed for the layers of interest, the overlay error between narrow and wide field layers on the wafer 24 will be measured using an overlay metrology tool or instrument 110, with the measuring of wafer field layers represented by the dotted line 112 in FIG. 1A. The identifying of the X-Y misregistration errors by the metrology tool 110 is by using structures that are patterned on the wafer. The pattern of measurement locations on the wafer is significant to the proper operation of the invention.

As shown in FIG. 1A, the measurements obtained by the overlay metrology tool 110 are forwarded to the digital computer 114, which includes processor 116 and associated memory 118 and stored software.

The processor 116 processes the measurements and calculates coefficients that identify the sources of overlay error on both the narrow field and wide field steppers 102, 106. These coefficients are components of a mathematical model that describes the systematic overlay vector fields that result from the various assignable sources of overlay error. These coefficients are further processed and fed back by connections 120, 122 to the stepper controllers 104, 108 respectively, as shown in FIG. 1A. This feedback dominates the assignable overlay sources and minimizes overlay error on subsequent wafers processed.

If two or more sources of overlay errors are found to be inseparable, the processor 116 and its associated software calculate a single composite coefficient for the inseparable sources. The inseparable coefficient is then assigned entirely to one source or shared between sources such that the sum of the individual source contributions is equal to the whole of the composite contribution.

For example, wide and narrow field translation errors are always inseparable components. The relative nature of the overlay measurements indicates that it is not possible to isolate independent values for $T_{xn}$ and $T_{xw}$.

It is possible to isolate the sum of the components ($T_{x*} = T_{xn} + T_{xw}$) and then apply this sum entirely to one stepper system to achieve full correction. In essence, there are an infinite number of possible solutions for $T_{xn}$ and $T_{xw}$, but only one unique solution for their sum $T_{x*}$. This phenomena is true for many but not all of the assignable sources of overlay error in 2:1 matching. In contrast, this phenomena is applicable to all components considered in 1:1 matching scenarios—none of the 1:1 assignable components are uniquely attributable to a specific layer.

Existing 1:1 overlay analysis models and algorithms fail to identify and distinguish separable and inseparable sources of overlay error. The system according to the present invention is capable of identifying those sources, native to 2:1 field matching, that result in separable components between layers. The system is also capable of calculating the magnitude of the contribution from each of the separable components.

An example of components that are separable under 2:1 matching would be the stage scale coefficients, $S_{xn}$ and $S_{xw}$, which are fully separable for the case where the wide and narrow fields are horizontally aligned. For a given experiment, there is a unique solution for the values of both $S_{xn}$ and $S_{xw}$. This system according to the present invention is capable of calculating those unique values.

For purposes of illustration of the operation of the system according to the present invention, the following assumptions can be made:

1. One or more narrow field steppers pattern one or more layers on a wafer.
2. One or more wide field steppers pattern one or more layers on the same wafer.
3. The wide and narrow fields are matched horizontally, as shown in both FIG. 1 and FIG. 2.
4. The resulting wafer is measured using an overlay metrology tool with known measurement accuracy and repeatability.
5. TIS (tool induced shift) is corrected for the metrology tool using accepted techniques.
6. At least one overlay structure is measured in each narrow field.
7. Measurement patterns are repeated within each narrow field and within each wide field that contain any measured locations.
8. The pattern of measured overlay structures is symmetric across X and Y axes in both the narrow field and wide field coordinate systems. FIG. 3 shows an example of an acceptable overlay measurement strategy.

Reference is now made to FIG. 2 and FIG. 4 in the definition of coordinate variables utilized in the family of algorithms embodied within this invention.

The grid (interfield) coordinate system for each of the two steppers is defined as follows:

| | |
|---|---|
| $(X_w, Y_w)$ | X-Y coordinates of the center of the wide field in which the point of interest resides relative to the center 20 of the wafer 24. All points residing in the same wide field will have the same wide field grid coordinates regardless of their position within the field. |
| $(X_n, Y_n)$ | X-Y coordinates of the center of the narrow field in which the point of interest resides relative to the center 20 of the wafer 24. All points residing in the same narrow field will have the same narrow field grid coordinates regardless of their position within the field. |
| $\Delta X_w$ | The X direction stage step distance between adjacent fields on the wide field stepper 106. |
| $\Delta Y_w$ | The Y direction stage step distance between adjacent fields on the wide field stepper 106. |
| $\Delta X_n$ | The X direction stage step distance between adjacent fields on the narrow field stepper 102. |
| $\Delta Y_n$ | The Y direction stage step distance between adjacent fields on the narrow field stepper 102. |

The offsetting of field rows (field bricking) is not shown in FIG. 2 and FIG. 4 because the software process according to the present invention are insensitive to the utilization of field bricking.

Figure 5:
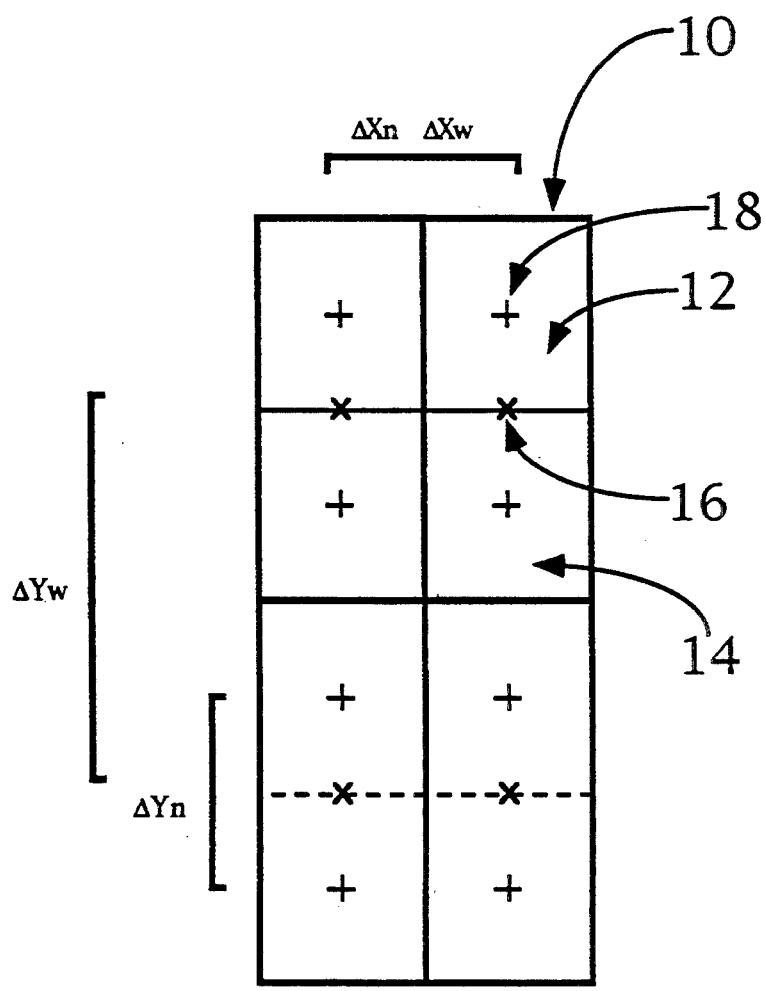
FIG. 5 represents the top-down view of four wide exposure fields overlayed upon eight narrow exposure fields for the vertical matching case. The geometric centers of the narrow and wide fields is indicated for each of the twelve fields. The stepper stage increments $\Delta X_n$, $\Delta Y_n$, $\Delta X_w$, and $\Delta Y_w$, are defined relative to the field geometries.

The embodiment described herein is dependent on the horizontal matching of the wide and narrow fields as shown in FIG. 1 and FIG. 2. However, it is understood to one skilled that the scope of this invention also covers the application of vertical 2:1 field matching, as shown in FIG. 5, as the modification of this specific embodiment required for application to the vertical matching case involves a pair of trivial 90 degree coordinate transforms and does not alter the structure of the described embodiment beyond these transforms.

The following mathematical relationships are developed from the geometric relationships between the wide and narrow fields as shown in FIG. 2.

| | |
|---|---|
| $\Delta X_w = 2 \Delta X_n$ | ; 2:1 field stepping |
| $\Delta Y_w = \Delta Y_n$ | ; Y step is same on both |
| $X_w = X_n + \frac{1}{2} \Delta X_n$ | ; for ODD narrow field columns |
| $X_w = X_n - \frac{1}{2} \Delta X_n$ | ; for EVEN narrow field columns |
| $X_n = X_w - \frac{1}{4} \Delta X_w$ | ; for ODD narrow field columns |
| $X_n = X_w + \frac{1}{4} \Delta X_w$ | ; for EVEN narrow field columns |
| $Y_w = Y_n$ | ; for all points |
| $x_w = x_n - \frac{1}{2} \Delta X_n$ | ; for ODD narrow field columns |
| $x_w = x_n + \frac{1}{2} \Delta X_n$ | ; for EVEN narrow field columns |
| $x_n = x_w + \frac{1}{4} \Delta X_w$ | ; for ODD narrow field columns |
| $x_n = x_w - \frac{1}{4} \Delta X_w$ | ; for EVEN narrow field columns |
| $y_w = y_n$ | ; for all points. |

Figure 6:
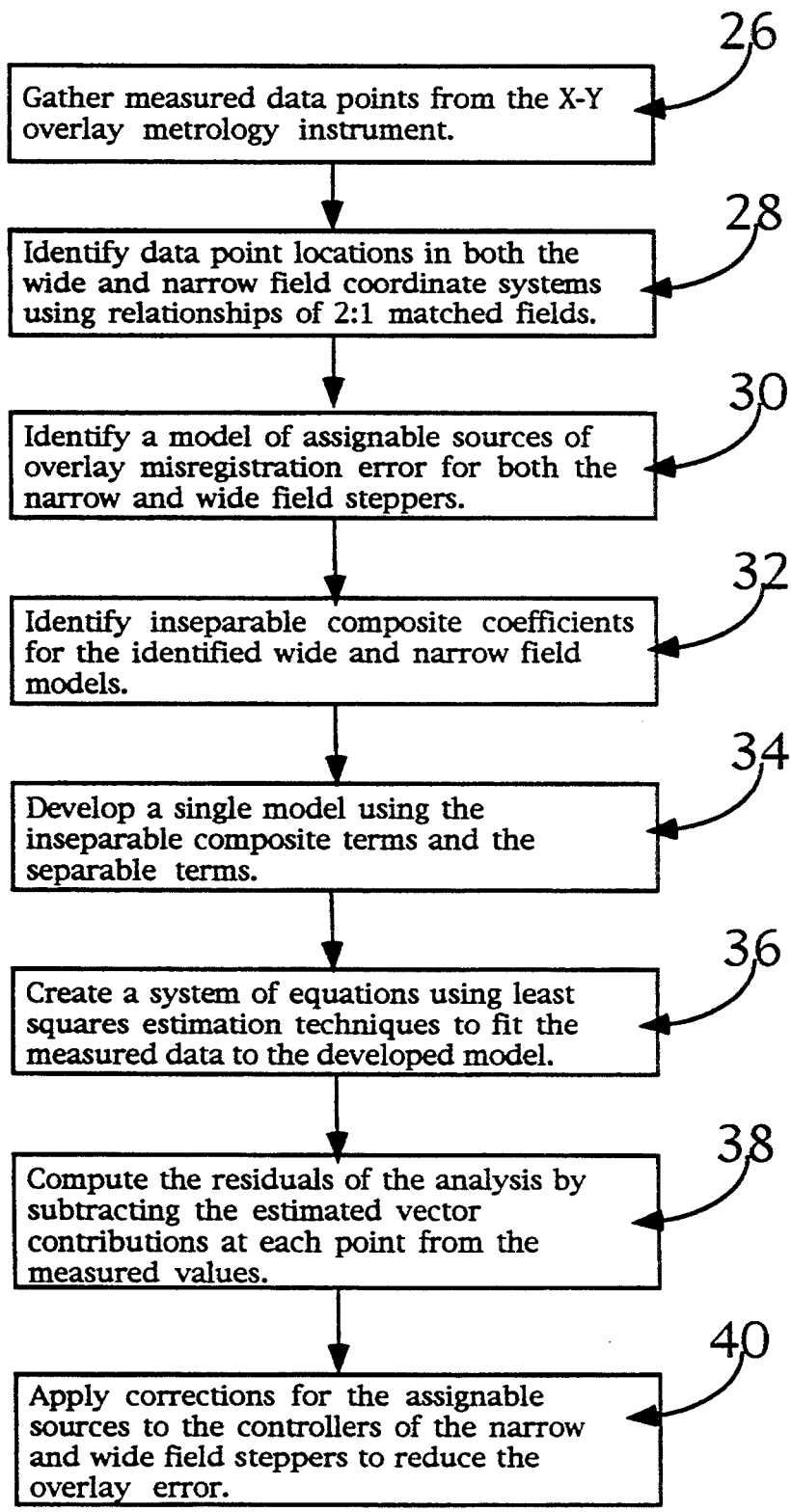
FIG. 6 is an exemplary flow chart showing the steps involved in the characterization of the steppers.

Reference is now made to FIG. 6 of the drawings which represents the flow chart of the process that is part of the system that embodies the present invention.

1. A data set is composed, representing the overlay error vectors describing the misregistration between a narrow field layer and a wide field layer. This data set is supplied in step 26 by the X-Y overlay metrology tool or instrument 110 satisfying requirements described earlier herein. Each vector in the data set can be described in X-Y component form as follows:

$$M_x(i) = M_x(X_n(i), Y_n(i), x_n(i), y_n(i))$$

$$M_y(i) = M_y(X_n(i), Y_n(i), x_n(i), y_n(i))$$

where i is the index of the vector within the data set. Each point in the data set will have a unique index, stored as an integer with a value between 0 and N−1, where N is the number of data points in the data set.

2. For each data point, an alternative description is provided in step 28 as follows, utilizing the mathematical relationships between the wide and narrow field coordinate systems:

$$M_x(i) = M_x(X_w(i), Y_w(i), x_w(i), y_w(i))$$

$$M_y(i) = M_y(X_w(i), Y_w(i), x_w(i), y_w(i))$$

3. Mathematical models are selected in step 30 that describe the sources of assignable overlay error for both the narrow field stepper 102 and the wide field stepper 106. Typical examples of these models would include the following:

$$V_{nx}(i) = T_{xn} + S_{xn}X_n(i) + \theta_{gn}Y_n(i) - \Phi_n Y_n(i)$$

$$V_{ny}(i) = T_{yn} + S_{yn}Y_n(i) - \theta_{gn}X_n(i)$$

$$V_{wx}(i) = T_{xw} + S_{xw}X_w(i) + \theta_{gw}Y_w(i) - \Phi_n Y_w(i)$$

$$V_{wy}(i) = T_{yw} + S_{yw}Y_w(i) - \theta_{gw}X_w(i)$$

where:

| | |
|---|---|
| $V_{nx}(i)$ | The estimate of the X error vector contribution of the narrow field stepper 102 at the location associated with measurement i. |
| $V_{ny}(i)$ | The estimate of the Y error vector contribution of the narrow field stepper 102 at the location associated with measurement i. |
| $V_{wx}(i)$ | The estimate of the X error vector contribution of the wide field stepper 106 at the location associated with measurement i. |
| $V_{wy}(i)$ | The estimate of the Y error vector contribution of the wide field stepper 106 at the location associated with measurement i. |

The coefficients of the above model equations are defined as follows:

| | |
|---|---|
| $T_{xn}$ | The X offset (translation) error induced by the narrow field stepper 102. ($\mu$m) |
| $T_{yn}$ | The Y offset (translation) error induced by the narrow field stepper 102. ($\mu$m) |
| $T_{xw}$ | The X offset (translation) error induced by the wide field stepper 106. ($\mu$m) |
| $T_{yw}$ | The Y offset (translation) error induced by the wide field stepper 106. ($\mu$m) |
| $S_{xn}$ | The X scale error induced by the narrow field stepper 102. (ppm) |
| $S_{yn}$ | The Y scale error induced by the narrow field stepper 102. (ppm) |
| $S_{xw}$ | The X scale error induced by the wide field stepper 106. (ppm) |
| $S_{yw}$ | The Y scale error induced by the wide field stepper 106. (ppm) |
| $\theta_{gn}$ | The wafer rotation error of the narrow field stepper 102. ($\mu$ radians) |
| $\theta_{gw}$ | The wafer rotation error of the wide field stepper 106. ($\mu$ radians) |
| $\Phi_n$ | The wafer orthogonality error of the narrow field stepper 102. (ppm) |
| $\Phi_w$ | The wafer orthogonality error of the wide field stepper 106. (ppm) |

4. Inseparable coefficients from the wide and narrow field models are identified and lumped into composite terms in step 32. For the case where horizontal 2:1 field matching is employed, the inseparable coefficients are those that do not appear in any terms with either $X_w$, $X_n$, $x_w$ or $x_n$. This leads to the definition of the following inseparable composite coefficients:

$$T_{x*} = (T_{xn} + T_{xw})$$

$$T_{y*} = (T_{yn} + T_{yw})$$

$$S_{y*} = (S_{yn} + S_{yw})$$

$$\Phi_* = (\Phi_n + \Phi_w)$$

5. Develop a single model in step 34 that includes the composite coefficients and the separable wide and narrow field coefficients remaining after step 32. For this example, this action would result in the following:

$$V_{*x}(i) = T_{x*} + S_{xn}X_n(i) + \theta_{gn}Y_n(i) - \Phi_* Y_n(i) + S_{xw}X_w(i) + \theta_{gw}Y_w(i)$$

$$V_{*y}(i) = T_{y*} + S_{y*}Y_n(i) - \theta_{gn}X_n(i) - \theta_{gw}X_w(i)$$

6. Develop a system of equations in step 36 that will solve for the values of the coefficients of the above equations using least-squares estimation techniques on the measured data. For this example, this action would result in the following system of equations, represented in the standard matrix form of $Ax = b$, where $$A = \begin{bmatrix} N & 0 & -\Sigma Y_w & +\Sigma X_w & 0 & -\Sigma Y_w & -\Sigma Y_w & +\Sigma X_n \\ 0 & N & +\Sigma X_w & 0 & +\Sigma Y_w & 0 & +\Sigma X_n & 0 \\ +\Sigma Y_w & -\Sigma X_w & -\Sigma Q_1 & +\Sigma Q_2 & -\Sigma Q_2 & +\Sigma Y_w^2 & -\Sigma Q_3 & +\Sigma Q_4 \\ +\Sigma X_w & 0 & -\Sigma Q_2 & +\Sigma X_w^2 & 0 & -\Sigma Q_2 & -\Sigma Q_2 & +\Sigma Q_5 \\ 0 & +\Sigma Y_w & +\Sigma Q_2 & 0 & +\Sigma Y_w^2 & 0 & +\Sigma Q_4 & 0 \\ -\Sigma Y_w & 0 & +\Sigma Y_w^2 & -\Sigma Q_2 & 0 & +\Sigma Y_w^2 & +\Sigma Y_w^2 & -\Sigma Q_4 \\ +\Sigma Y_w & -\Sigma X_N & -\Sigma Q_2 & +\Sigma Q_2 & -\Sigma Q_2 & -\Sigma Y_w^2 & -\Sigma Q_6 & +\Sigma Q_4 \\ +\Sigma X_n & 0 & -\Sigma Q_4 & +\Sigma Q_5 & 0 & -\Sigma Q_4 & -\Sigma Q_4 & +\Sigma X_n^2 \end{bmatrix}$$

and $$x = \begin{bmatrix} T_{x*} \\ T_{y*} \\ \Theta_w \\ S_{xw} \\ S_{y*} \\ \Phi_* \\ \Theta_n \\ S_{xn} \end{bmatrix} \quad b = \begin{bmatrix} \Sigma M_x(i) \\ \Sigma M_y(i) \\ \Sigma M_x(i)Y_w(i) - \Sigma M_y(i)X_w(i) \\ \Sigma M_x(i)X_w(i) \\ \Sigma M_y(i)Y_w(i) \\ -\Sigma M_x(i)Y_w(i) \\ \Sigma M_x(i)Y_n(i) - \Sigma M_y(i)X_n(i) \\ \Sigma M_x(i)X_n(i) \end{bmatrix}$$

where $Q_1 = (X_w^2 + Y_w^2)$ $Q_2 = (X_w Y_w)$ $Q_3 = (X_n X_w + Y_w^2)$ $Q_4 = (X_n Y_w)$ $Q_5 = (X_n X_w)$ $Q_6 = (X_n^2 + Y_w^2)$.

7. Compute the residual (RES) of the analysis in step 38. This is the difference between the measured data points and the estimate of the overlay error at that point as calculated using the coefficients provided by the least squares estimator.

$$RES_{x*}(i) = M_x(i) - V_{*x}(i)$$

$$RES_{y*}(i) = M_y(i) - V_{*y}(i)$$

If additional assumptions are made about the pattern of overlay measurements, it is possible to combine intrafield terms into the mathematical models introduced in step 32 of the embodied process.

Figure 7:
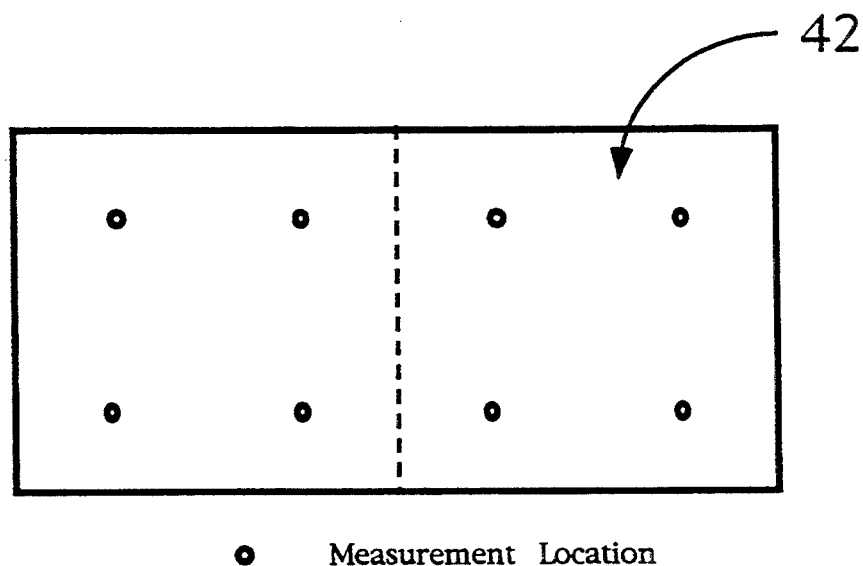
FIG. 7 represents a minimally acceptable pattern for the location of measurement sites within a 2:1 matching field given that the assignable intrafield components are limited to first order terms.

If the narrow field measurement patterns contain at least four points 42, with X and Y spans of at least two, as shown in FIG. 7, the models introduced in step 32 can include first order intrafield terms, as shown below.

$$V_{nx}(i) = T_{xn} + S_{xn} X_n(i) + \theta_{gn} Y_n(i) - \Phi_n Y_n(i) + R_n x_n + \theta_{in} y_n$$

$$V_{ny}(i) = T_{yn} + S_{yn} Y_n(i) - \theta_{gn} X_n(i) + R_n y_n - \theta_{in} x_n$$

$$V_{wx}(i) = T_{xw} + S_{xw} X_w(i) + \theta_{gw} Y_w(i) - \Phi_n Y_w(i) + R_w x_w + \theta_{iw} y_w$$

$$V_{wy}(i) = T_{yw} + S_{yw} Y_w(i) - \theta_{gw} X_w(i) + R_w y_w - \theta_{iw} x_w$$

The newly introduced coefficients of the above model equations are defined as follows:

| | |
|---|---|
| $R_n$ | The reduction (magnification) error assignable to the narrow field stepper 102. (ppm) |
| $R_w$ | The reduction (magnification) error assignable to the wide field stepper 106. (ppm) |
| $\Theta_{in}$ | The intrafield rotation error assignable to the narrow field stepper 102. ($\mu$ radians) |
| $\Theta_{iw}$ | The intrafield rotation error assignable to the wide field stepper 106. ($\mu$ radians) |

Figure 8:
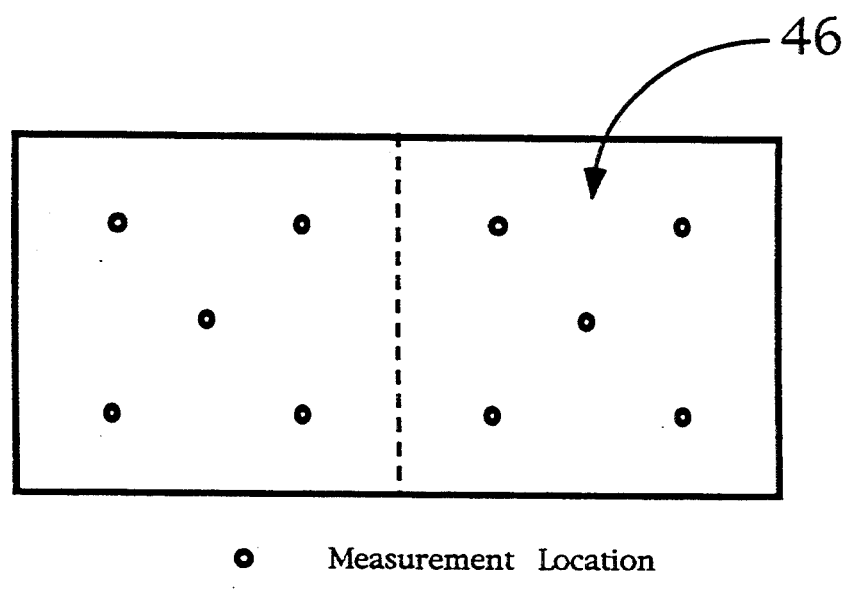
FIG. 8 represents a minimally acceptable pattern for the location of measurement sites within a 2:1 matching field given that the assignable intrafield components are limited to first and second-order terms.

If the narrow field measurement patterns contain at least five points 46, with X and Y spans of at least three, as shown in FIG. 8, the models introduced in step 32 can include both first and second order intrafield terms, as shown below.

$$V_{nx}(i) = T_{xn} + S_{xn} X_n(i) + \theta_{gn} Y_n(i) - \Phi_n Y_n$$

$$(i) + R_n x_n + \theta_{in} y_n + \Psi_{1n} x_n^2 + \Psi_{2n} x_n y_n$$

$$V_{ny}(i) = T_{yn} + S_{yn} Y_n(i) - \theta_{gn} X_n$$

$$(i) + R_n y_n - \theta_{in} x_n + \Psi_{1n} x_n y_n + \Psi_{2n} y_n^2$$

$$V_{wx}(i) = T_{xw} + S_{xw} X_w(i) + \theta_{gw} Y_w(i) - \Phi_n Y_w$$

$$(i) + R_w x_w + \theta_{iw} y_w + \Psi_{1w} x_w^2 + \Psi_{2w} x_w y_w$$

$$V_{wy}(i) = T_{yw} + S_{yw} Y_w(i) - \theta_{gw} X_w$$

$$(i) + R_w y_w - \theta_{iw} x_w + \Psi_{1w} x_w y_w + \Psi_{2w} y_w^2$$

The newly introduced coefficients of the above model equations are defined as follows:

| | |
|---|---|
| $\Psi_{1n}, \Psi_{2n}$ | The field tilt error of the narrow field stepper 102. (nm/mm$^2$) |
| $\Psi_{1w}, \Psi_{2w}$ | The field tilt error of the wide field stepper 106. (nm/mm$^2$) |

In this example, the four new intrafield coefficients are completely separable and have unique solutions as they each appear in at least one term in the model along with the $x_n$ or $x_w$ variables.

Referring again to FIG. 6, the residuals are then applied in step 74 to the stepper controllers 104, 108 of the narrow field and wide field steppers 102, 106, respectively, as a feedback mechanism to adjust the steppers, resulting in a reduction of overlay error to a minimum.

While the invention has been particularly shown and described with reference to the preferred embodiments, it will be understood by those skilled in the art that various modifications in form and detail may be made therein without departing from the scope and spirit of the invention. Accordingly, modifications such as those suggested above, but not limited thereto, are to be considered within the scope of the invention.

What is claimed is:

1. An overlay optimization system for registering field patterns on wafers comprising:

a first field stepper for registering a first field pattern;

a second field stepper for registering a second field pattern overlaying said first field pattern;

an overlay measuring instrument for measuring pattern misregistration data of said first and second field patterns;

means for generating an overlay coefficient associated with an assignable source of overlay error from said pattern misregistration data;

means for calculating the overlay error associated with said assignable source using said overlay coefficient; and means for adjusting said first and second field steppers for reducing said overlay error.

2. The overlay optimization system as recited in claim 1 wherein said means for generating generates said overlay coefficient by least squares estimation using said pattern misregistration data.

3. The overlay optimization system as recited in claim 1 wherein:

said means for generating further generates a composite coefficient associated with a plurality of inseparable assignable sources of overlay error; and said means for calculating further calculates said overlay error using said composite coefficient.

4. The overlay optimization system as recited in claim 3 wherein:

said means for generating assigns said composite coefficient to a first inseparable assignable source of overlay error; and said means for adjusting adjusts said first inseparable assignable source using said composite coefficient.

5. The overlay optimization system as recited in claim 4 wherein:

said means for generating generates said composite coefficient from a plurality of assignable sources of overlay error including at least one of the inseparable assignable sources of overlay error; and said means for adjusting adjusts each assignable source using a portion of said overlay error corresponding to a relative contribution of each assignable source to the composite coefficient.

6. The overlay optimization system as recited in claim 1 wherein the second field stepper registers the second field pattern being at least twice the area of the first field pattern.

7. An overlay optimization system for manufacturing a wafer using heterogenous field imaging of patterns, comprising:
   a first field stepper having a first field size;
   a second field stepper having a second field size, the second field size being greater than the first field size;
   means for measuring a plurality of coordinates of a plurality of patterns laid down by said first field stepper and said second field stepper;
   a processor for processing said plurality of coordinates to generate an overlay coefficient associated with an assignable source of overlay error, said processor for calculating the overlay error associated with the plurality of patterns associated with said assignable source using said overlay coefficient; and
   means for adjusting a respective stepper controller of said first stepper and said second stepper to reduce said overlay error.

8. The overlay optimization system as recited in claim 7 wherein said processor uses least squares estimation to generate said overlay coefficient from said plurality of coordinates.

9. The overlay optimization system as recited in claim 7 wherein the second field stepper has the second field size being twice the first field size for 2:1 field matching.

10. A method for optimizing wafer stepper overlaying using a first field stepper, a second field stepper and a processor, comprising the steps of:
    patterning a first field layer on a wafer using the first field stepper;
    patterning a second field layer overlaying said first field layer using the second field stepper;
    measuring overlay misregistration between the first field layer and the second field layer as misregistration data;
    processing the misregistration data to generate an overlay coefficient associated with an assignable source of overlay error from the misregistration data;
    calculating the overlay error associated with said assignable source using said overlay coefficient; and
    adjusting the patterning of the first field stepper and the second field stepper to reduce said overlay error, 11. The method as recited in claim 10 wherein the step of processing the misregistration data further comprises the step of correlating said misregistration data with corresponding assignable sources of overlay error.

12. The method as recited in claim 10 wherein said step of generating further comprises generating said overlay coefficient by least squares estimation using said pattern misregistration data.

13. The method as recited in claim 10 further comprising the steps of generating a composite coefficient associated with a plurality of inseparable assignable sources of overlay error; and
    calculating said overlay error using said composite coefficient.

14. The method as recited in claim 13 further comprising the steps of:
    assigning said composite coefficient to a first inseparable assignable source of overlay error; and
    adjusting said first inseparable assignable source using said composite coefficient.

15. The method as recited in claim 13 further comprising the steps of:
    generating said composite coefficient from a plurality of assignable sources of overlay error including at least one of the inseparable assignable sources of overlay error; and
    adjusting each assignable source of overlay error using a portion of said overlay error corresponding to a relative contribution of each assignable source to the composite coefficient.

16. The method as recited in claim 10 wherein the step of patterning the second field layer includes the step of patterning the second field layer having an area twice the area of the first field layer.

* * * * *